(12) United States Patent
McBride

(10) Patent No.: US 6,327,542 B1
(45) Date of Patent: Dec. 4, 2001

(54) SYSTEM AND METHOD FOR APPROXIMATING THE COUPLING VOLTAGE NOISE ON A NODE

(75) Inventor: John G McBride, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/358,837

(22) Filed: Jul. 21, 1999

(51) Int. Cl.[7] ............................. G06F 19/00; G06F 17/00
(52) U.S. Cl. ...................... 702/64; 702/191; 703/13; 716/5; 716/19
(58) Field of Search ...................... 702/64, 65, 69, 702/81, 84, 189, 191; 716/5, 15, 19; 703/13, 14, 17; 361/767, 774, 775

(56) References Cited

U.S. PATENT DOCUMENTS 5,535,133 * 7/1996 Petschauer et al. ................. 716/19
5,555,506 * 9/1996 Petschauer et al. ................. 703/13
5,596,506 * 1/1997 Petschauer et al. ................. 716/5

* cited by examiner

Primary Examiner—Hal Wachsman
Assistant Examiner—Bryan Bui

(57) ABSTRACT

The present invention is generally directed to a system and method for approximating the coupling cross- a node in a circuit and determining whether the coupling voltage noise exceeds a permissible value. In accordance with one aspect of the invention, a method uses a first circuit model to obtain a total resistance value of a conductor extending between a driver configured to drive the node and a receiver, and uses a second circuit model to determine a total capacitance. The method also determines an aggressor coupling capacitance between the node and an aggressor signal using at least one criteria, and computes a ground capacitance by subtracting the aggressor coupling capacitance from the total capacitance. The method also determines the effective resistance of the driver, and a weighted average rise time for all aggressor signals on the node. Using a third circuit model, with the values determined above, the method simulates the third circuit model to determine whether the coupling voltage noise of the node exceeds a predetermined value.

18 Claims, 8 Drawing Sheets

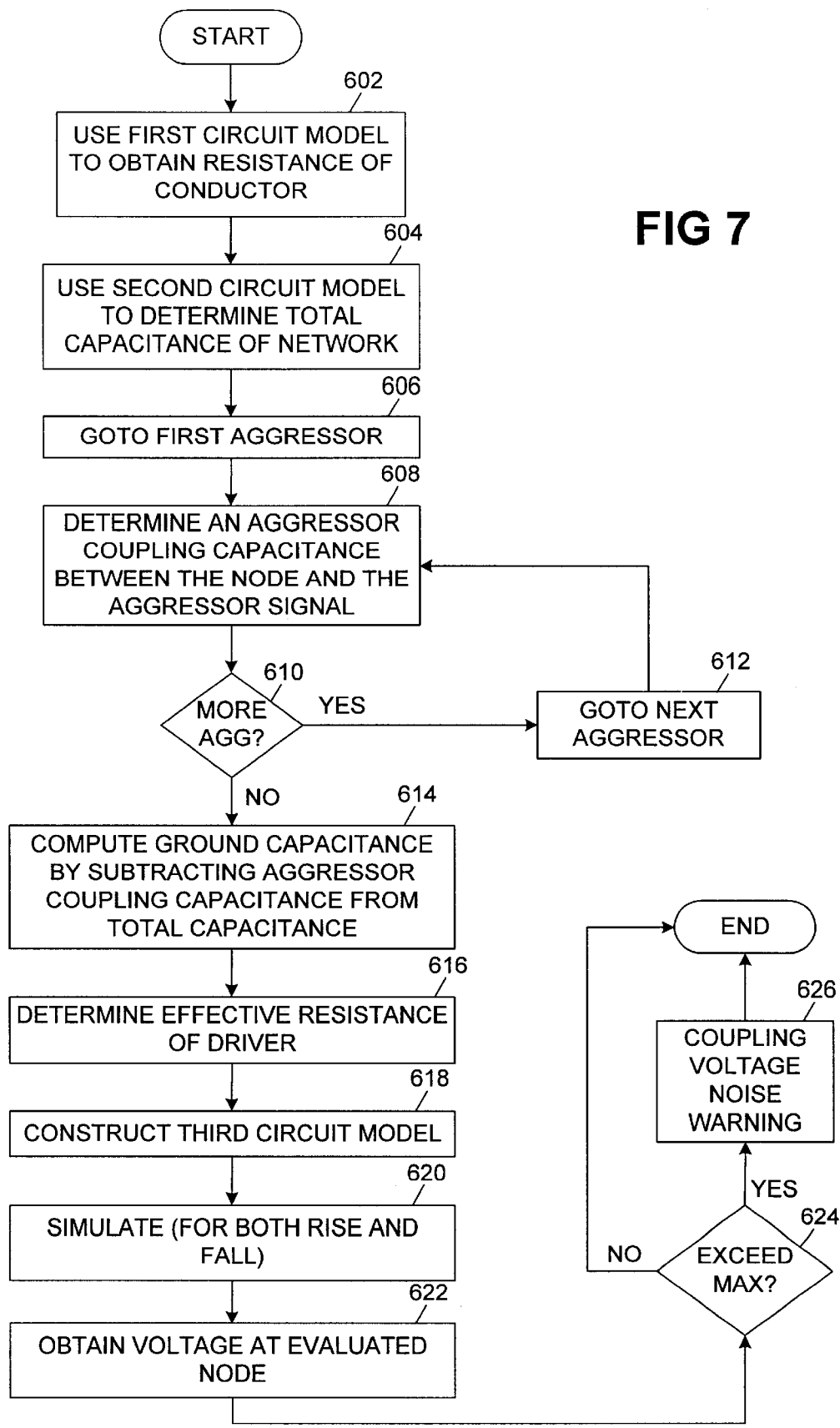

SYSTEM AND METHOD FOR APPROXIMATING THE COUPLING VOLTAGE NOISE ON A NODE

BACKGROUND OF THE INVENTION

1. Field of the Invention

The present invention generally relates to computer-aided circuit design systems, and more particularly to a system and method for evaluating a netlist file and approximating the coupling voltage noise on a node

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

An integrated circuit design can be represented at different levels of abstraction, such as the Register-Transfer level (RTL) and the logic level, using a 1hardware description language (HDL). VHDL and Verilog are examples of HDL languages. At any abstraction level, an integrated circuit design is specified using behavioral or structural descriptions or a mix of both. At the logical level, the behavioral description is specified using boolean equations. The structural description is represented as a netlist of primitive cells. Examples of primitive cells are full adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various circuit characteristics, attributes, or configurations that are not identified and/or addressed in the PathMill product and other similar products. For example, there is often a need to evaluate a circuit to detect a wide variety of potential design or layout pitfalls. One potential circuit pitfall relates to cross-talk (also referred to sometimes as cross-coupling or capacitive coupling) between signal lines. Specifically, in the design of VLSI chips, cross-talk may occur in deep, submicrometer interconnect systems.

Circuit simulations, such as SPICE, are known to provide the ability to analyze a circuit design and layout for cross-talk. However, the extraction tool and analysis performed by SPICE is extremely detailed and involved. At the chip level, an extraction file may be on the order of gigabytes, and the run-time required for simulation may take several weeks.

Therefore, it would be desirable to provided an automated tool that can evaluate a netlist file of a large circuit design to identify particular circuit to closely approximate the capacitive coupling between signals (or the capacitive coupling on a particular circuit node) in a very efficient manner.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

The present invention is generally directed to a system and method for approximating the coupling voltage noise on a node in a circuit and determining whether the coupling voltage noise exceeds a permissible value. In accordance with one aspect of the invention, a method uses a first circuit model to obtain a total resistance value of a conductor extending between a driver configured to drive the node and a receiver, and uses a second circuit model to determine a total capacitance. The method also determines an aggressor coupling capacitance between the node and an aggressor signal using at least one criteria, and computes a ground capacitance by subtracting the aggressor coupling capacitance from the total capacitance. The method also determines the effective resistance of the driver, and a weighted average rise time for all aggressor signals on the node. Using a third circuit model, with the values determined above, the method simulates the third circuit model to determine whether the coupling voltage noise on the node exceeds a predetermined value.

DESCRIPTION OF THE DRAWINGS

The accompanying drawings incorporated in and forming a part of the specification, illustrate several aspects of the present invention, and together with the description serve to explain the principles of the invention. In the drawings:

FIG. 7 is a flow chart illustrating the top-level functional operation of a method according to one embodiment of the present invention;

DETAILED DESCRIPTION OF THE PREFERRED EMBODIMENT

Figure 1:
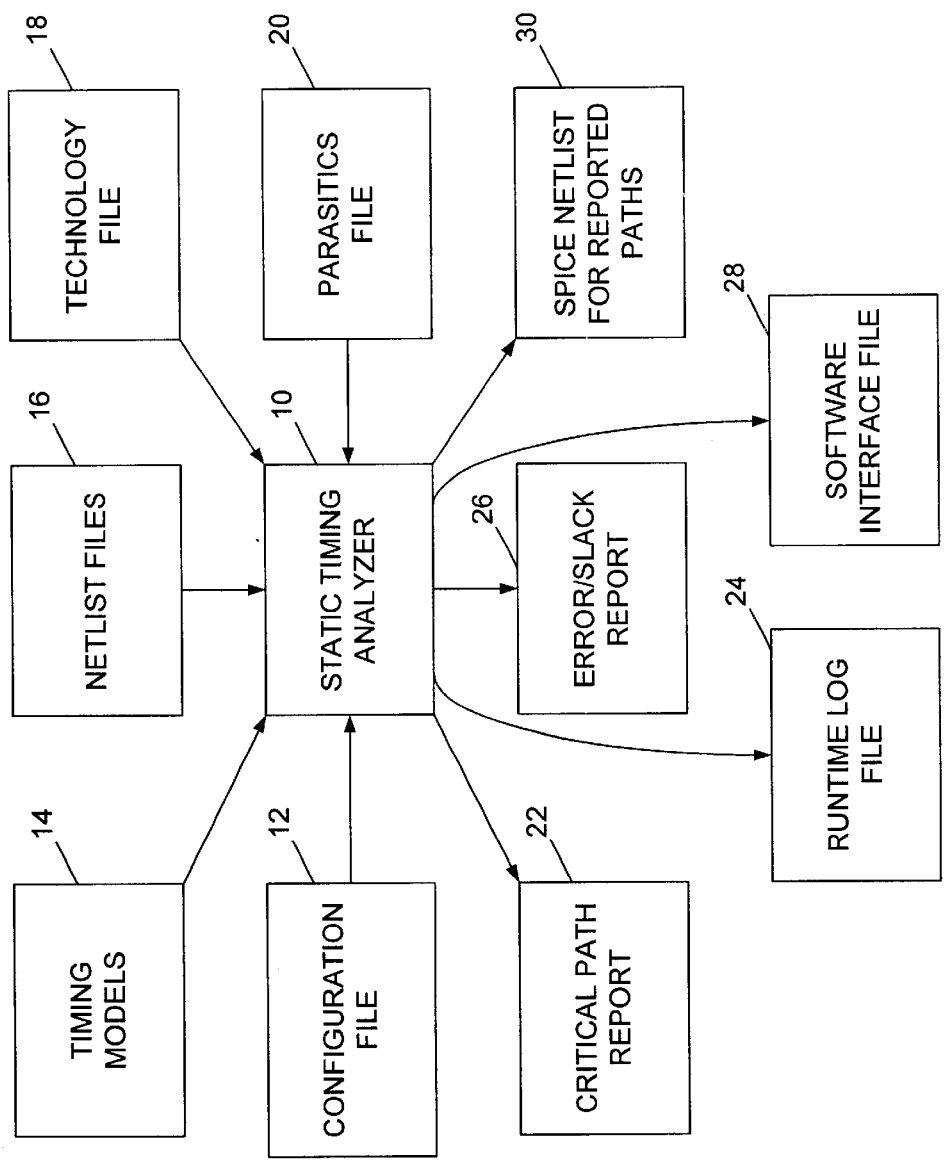
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration file(s) 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations.

Figure 2:
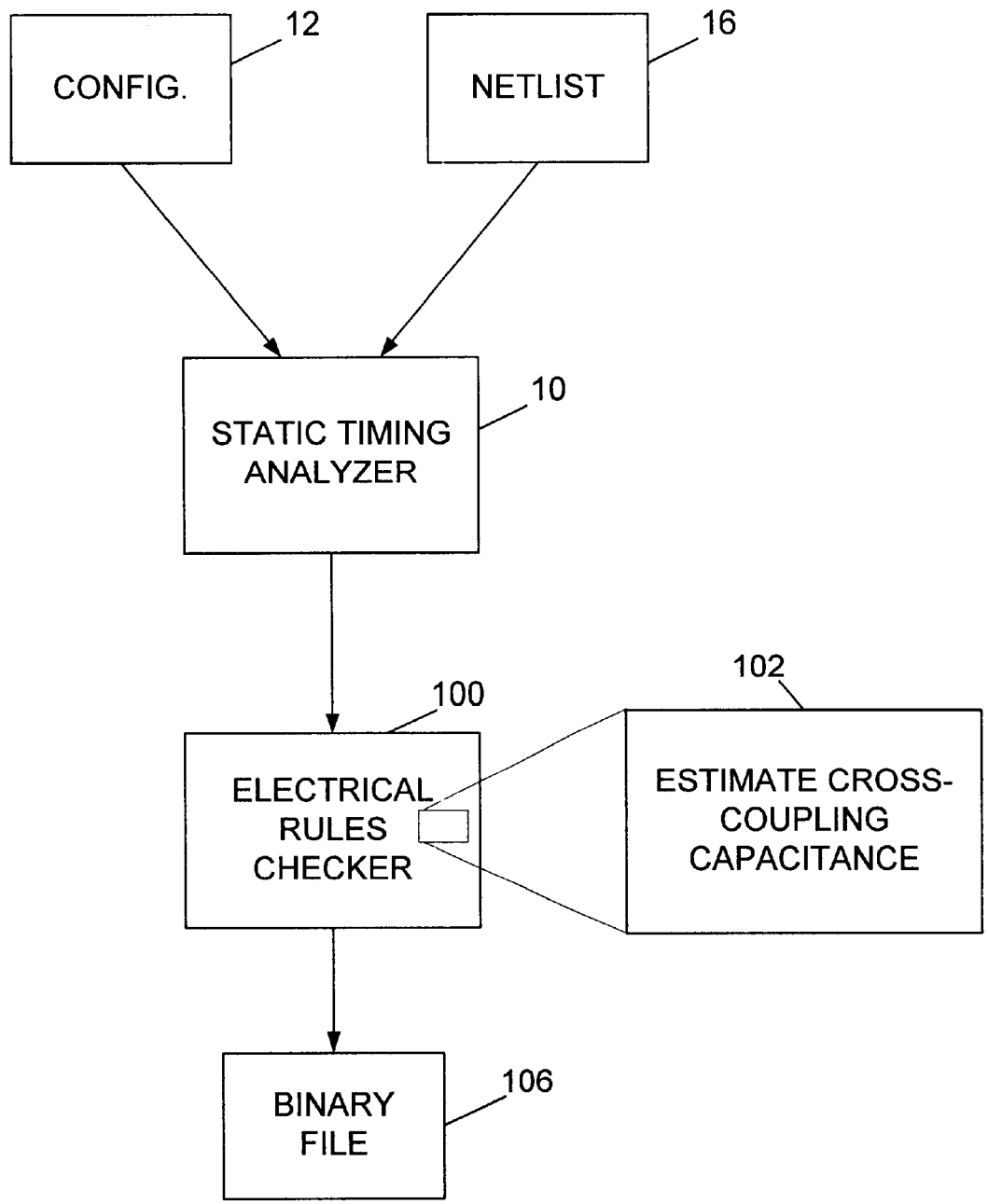
FIG. 2 is a block diagram illustrating the orientation of the electrical rules checking method of the present invention, in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion 102 of the electrical rules checker program 100 operates to detect circuit configurations (e.g., FETs) that are susceptible to bootstrapping.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated may be generated. This database may then be utilized by the electrical rules checker 100 of the present invention to perform the rules checking tasks. However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for optical computing systems, mechanical systems and chemical systems. It will be apparent to those skilled in the art how data structures similar to those generated for elements and nodes in the electrical context may be generated in mechanical, chemical and optical computing contexts and used for rules checking in those contexts.

The manner in which this database is generated is not necessary to an understanding of the present invention, and therefore need not be discussed herein.

Figure 3A:
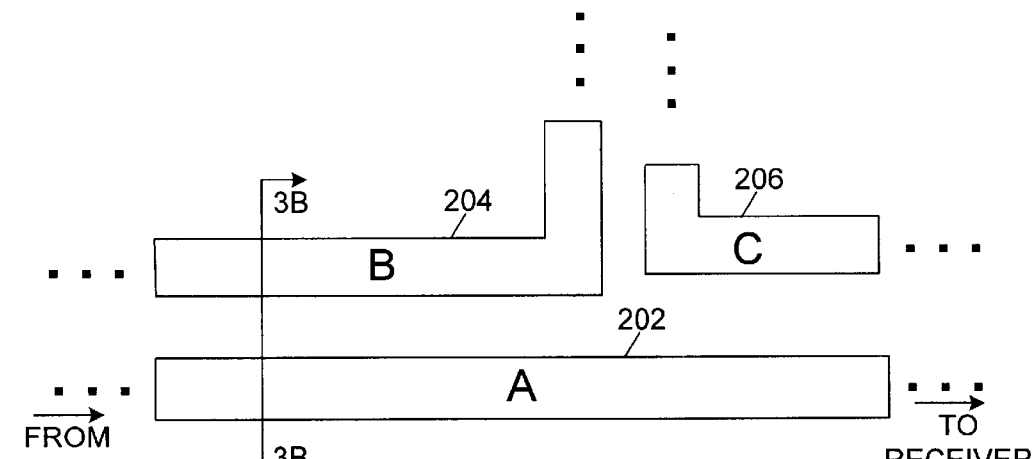
FIG. 3A is a top-view of a portion of a trace layout within an integrated circuit, illustrating closely disposed traces.
Figure 3B:
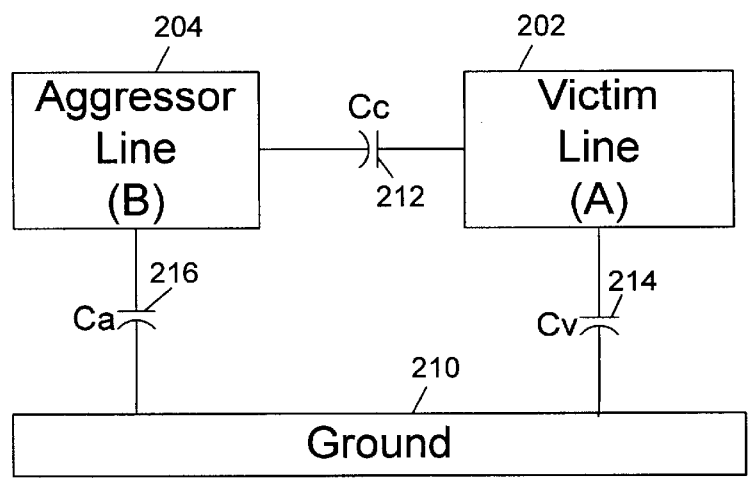
FIG. 3B is a cross sectional view taken substantially along line 3B—3B of FIG. 3A.

To better understand the concepts and operation of the present invention, reference is made to FIGS. 3A and 3B. FIG. 3A illustrates a top view of a portion of a 1layer of a semiconductor device having conductive traces or wires 202, 204, and 206.

For purposes of illustration, assume that wire 202 extends between a driver (not shown) and a receiver (not shown). As is known, and as will be further illustrated in connection with FIG. 4, due to the physical properties of the conductor 202, the conductor has an inherent resistance, as well as a capacitive coupling between the wire itself and ground. A phenomenon which results in the manufacturer of submicron integrated circuits relates to cross coupling capacitance. Due to the high density of circuit integration, additional conductors 204 and 206 are often laid out and disposed closely adjacent conductor 202. Portions of wires 204 and 206 are illustrated in FIG. 3A as being disposed parallel and closely adjacent to conductor 202 for a short distance, before being routed in another direction. It should be appreciated that the drawing illustrated in FIG. 3A has been contrived purely has a hypothetical example, but is representative of a typical layout.

In the illustrated embodiment, conductor 204 is disposed in slightly closer proximity to conductor 202, and extends near conductor 202 for a longer span than does conductor 206. Depending in part upon the signals carried on conductors 204 and 206, a cross coupling is observed between conductors 204 and 202, as well as conductor 206 and 202. That is, the signal carried on conductor 202 is capacitively coupled onto the signal carried on conductor 204. Similarly, the signal carried on 204 is capacitively coupled onto the signal carried on conductor 202. From a design standpoint, this cross coupling is preferably evaluated at a receiver (not shown), at the distal end of the conductor 202 from the driver (also not shown). From the standpoint of conductor 202, the signal lines 204 and 206 are sometimes referred to as "aggressor" lines, while conductor 202 is sometimes referred to as a "victim" line. Thus, although there is no electrical continuity between conductors 202 and 204, the signal carried on one of these lines affects the signal carried on the other. If the effect is great enough (i.e., if a coupling capacitance is too high), then signal degradation may occur to the extend that the circuit may not operate as designed.

Reference is made briefly to FIG. 3B, which is a sectional view as taken substantially along line 3B—3B of FIG. 3A, which sectional view cuts through conductors 202 and 204. As is known, the conductive traces 202 and 204 will have physical dimensions, which dimensions have been greatly exaggerated in FIG. 3B. Again, although there is no electrical continuity between these conductors 202 and 204, there is a capacitive coupling between the two lines, denoted by capacitor 212 (Cc). In addition, a capacitive element exists between each conductor and ground 212. In this regard, a capacitance 214 (Cv) exists between the victim line 202 and ground and a capacitance 216 (Ca) exists between the aggressor line 204 and ground 210. In accordance with one aspect of the present invention, these values may be estimated and used in connection with a very simple circuit model to compute the capacitive coupling at a given node.

Figure 4:
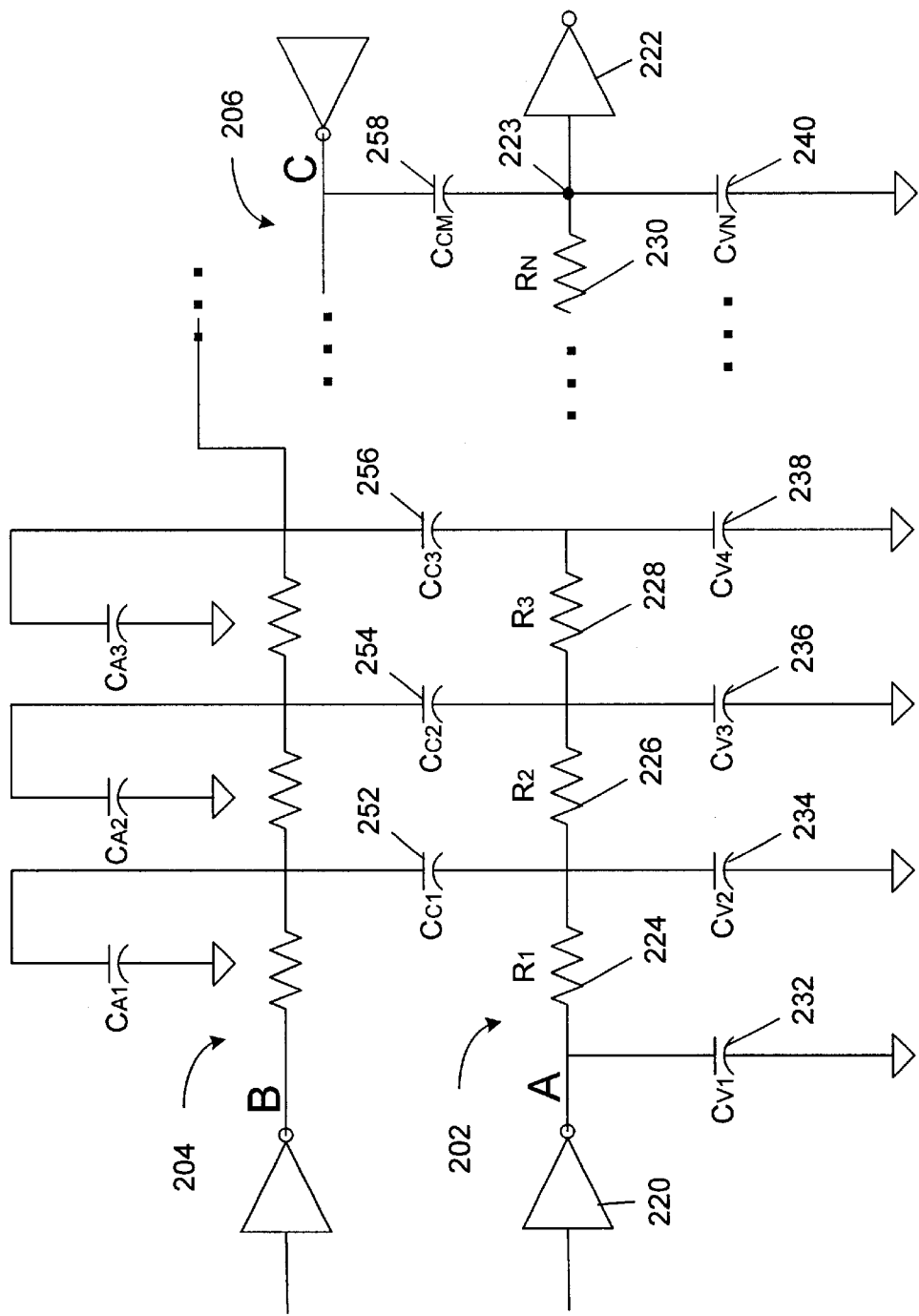
FIG. 4 is a schematic diagram illustrating a circuit equivalent to the trace portions illustrated in FIGS. 3A and 3B.

Before discussing the circuit model of the present invention, however, reference is first made to FIG. 4, which is a schematic diagram depicting certain physical properties of the circuit portion illustrated in FIG. 3A. Again, a victim conductive line 202 is illustrated, along with closely spaced aggressor lines 204 and 206. The victim line (the conductor under evaluation) extends between a driver 220 and a receiver 222. In accordance with the present invention, the coupling capacitance may be desired at a node 223 immediately adjacent the receiver 222. As is known, due to the physical properties of a conductive trace, the trace does not have a purely zero resistance. Instead, a small inherent resistance is manifest along the wire. This is typically represented by extraction tools through a plurality very small, series connected resistors 224, 226, 228, and 230, which extend the length the trace between the driver 220 and receiver 222. Likewise, a series of discrete capacitors are illustrated at various points along the conductor 202, extending between the conductor 202 and ground. This capacitance was represented in FIG. 3B by capacitor 214. However, a more realistic view is one like that illustrated in FIG. 4 having a plurality of conductors 232, 234, 236, 238, and 240. These capacitive values are typically on the order of atto-farads.

Likewise, other conductive traces 204 and 206 are modeled with a plurality of series connected resistors, and capacitors extending between the conductors 204 and 206 and ground. The coupling capacitance, represented in FIG. 3B by capacitor 212, is also more realistically represented by a plurality of capacitors 252, 254, 256, and 258. In a practical circuit model that is generated by extraction software, resistors and capacitors will be disposed along the length of a conductive trace, every few microns. Therefore, there may be hundreds, and even thousands of resistors and capacitors modeled along a given trace, between a driver 220 and a receiver 222. As a result, the mathematics involved in evaluating the circuit becomes extremely resource consuming and time extensive. In the context of an ASIC (Application Specific Integrated Circuit) having over a million transistors, the simulation of such a circuit may take days or even weeks to perform. Accordingly, there is a tremendous desire to provide a circuit model that greatly simplifies the simulation, in order to provide meaningful results in a reasonable period of time.

Figure 5:
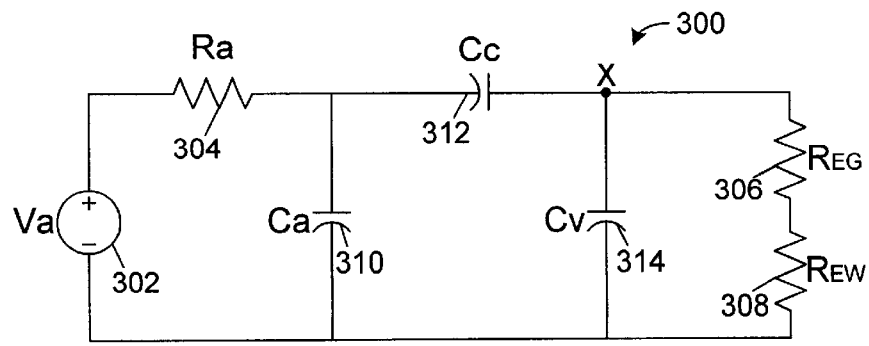
FIG. 5 is a circuit model utilized by the system and method of the present invention.

In this regard, the circuit 300 illustrated in FIG. 5, was developed to provided a qualitative measure of the coupling capacitance on a given node in a circuit, with minimal mathematical computations. Briefly, the circuit 300 comprises a voltage source 302 and resistors 304, 306, and 308. In addition, the circuit includes capacitors 310, 312, and 314. Broadly, the values of the various circuit components are computed and plugged into the circuit model of circuit 300. In this regard, the voltage source 302 is a time varying (preferably a ramp) voltage. With the various component values determined and plugged in, the voltage at node X (the node immediately adjacent the receiver) is evaluated and compared against a predetermined voltage level. If the simulated voltage level fails to meet or exceed a predetermined voltage level, then the system may generate a warning message, indicating that the coupling voltage noise on the given circuit node exceeds a permissible level. This will be a signal to the designer to evaluate this portion of the circuit and/chip layout more closely.

The inventive aspects of the system and method presented herein lie not only in a simplified modeling circuit, but also in the manner in which the component values for the model are derived. In this regard, capacitors 310, 312, and 314 correspond to the capacitance between the aggressor line and ground, the coupling capacitance between the aggressor line and the victim line, and the capacitance between the victim line and ground, respectively. Resistor 306 corresponds to the equivalent resistance of the gate 220 that drives the conductor 202. The resistor 308 corresponds to the equivalent resistance of a conductive wire extending between the driver 220 and receiver 222 (see FIG. 4). Resistor 304 corresponds to the effective wire resistance of the aggressor driver, at the end of its wire closest to the victim's receiver. Finally, the voltage source 302 is modeled by a voltage equal to the effective rise time or fall time of the aggressor network. In the preferred embodiment, this value is calculated by finding the weighted average of the various aggressor conductors that effect the victim line. This voltage may be expressed in the form the following equations:

$$Tr = \frac{\sum_{i=1}^{n} C_{Ci} - Tr_i}{\sum_{i=1}^{n} C_{Ci}} * K$$

and $$Tf = \frac{\sum_{i=1}^{n} C_{Ci} - Tf_i}{\sum_{i=1}^{n} C_{Ci}} * K$$

In this regard, i is an index for the array of aggressor lines, Cci equals the coupling capacitance from the ith aggressor to the victim, Tri equals the rise time of the ith aggressor, n is the number of aggressor lines deemed to be coupling onto the victim line, and K as a scaling factor correlating Tri to the worst case Tr, for a given signal. Likewise, Tf is computed as the fall time, and Tfi is fall time of the ith aggressor.

Figure 6A:
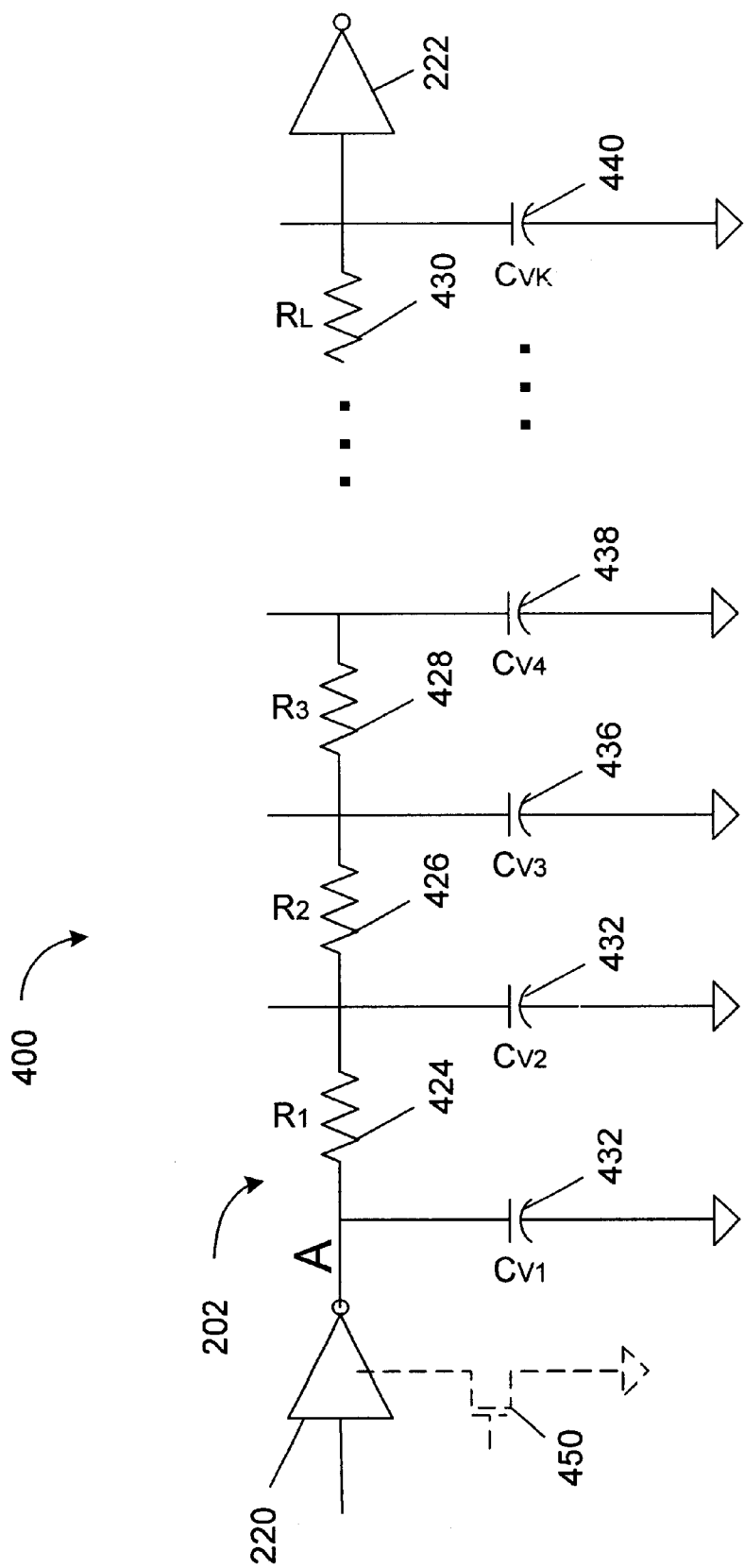
FIG. 6A is a first circuit model utilized by the preferred embodiment of the present invention, to obtain the total resistance of a conductive trace extending from a driver to a receiver.
Figure 6B:
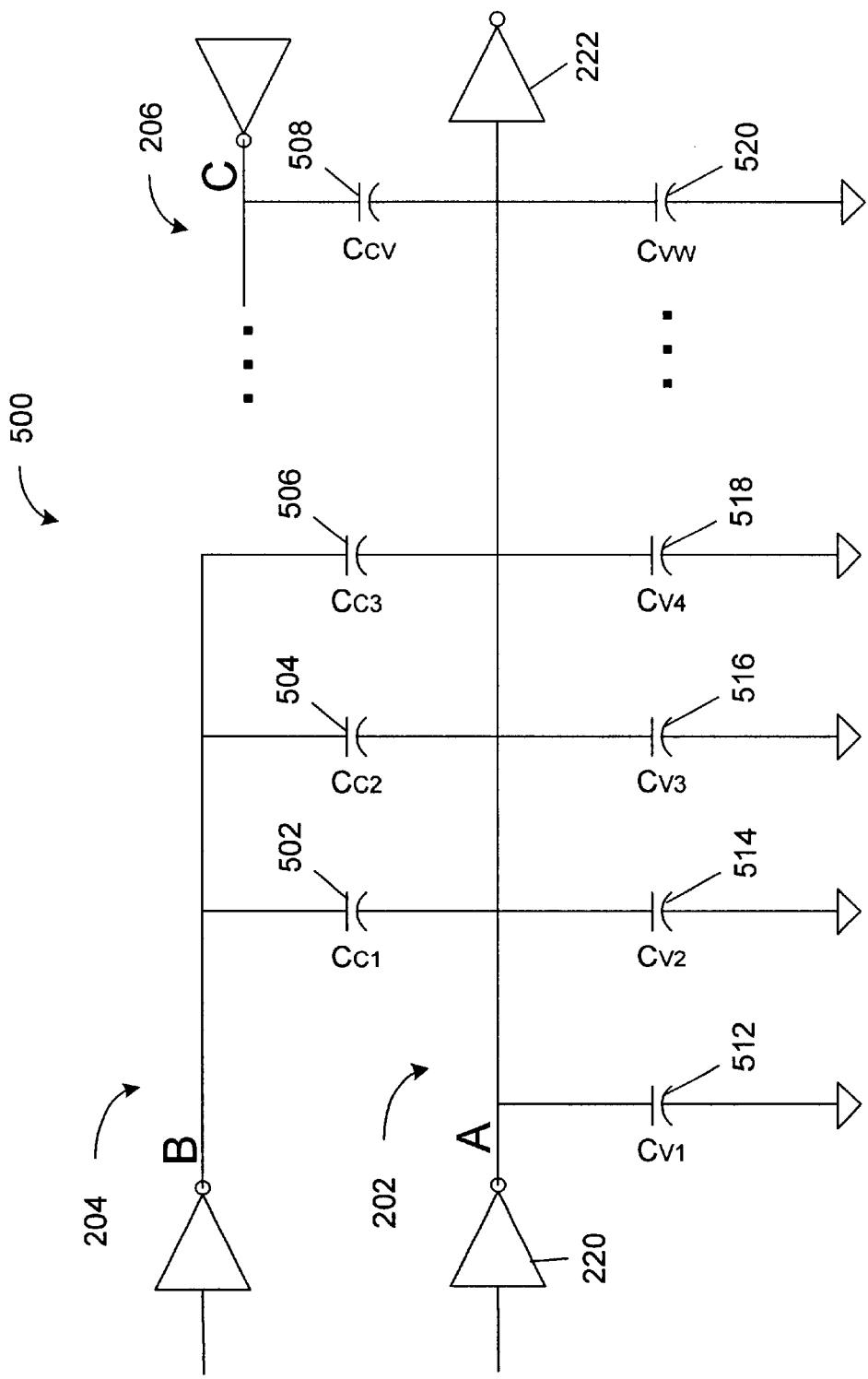
FIG. 6B is a second circuit model utilized by the preferred embodiment of the present invention, to obtain a total capacitance of a conductive trace network extending from a driver to a receiver.

In accordance with the present invention, various secondary circuit models are used in order to facilitate the determination of the various component values for the circuit model 300 of FIG. 5. In this regard, reference is made to FIGS. 6A and 6B, which are schematic diagrams illustrating the two circuit models utilized in connection with the preferred embodiment of the present invention. Referring first to FIG. 6A, a circuit 400 is a first model that is similar to the model illustrated in FIG. 4, except that it omits the aggressor lines, and the coupling capacitances between the aggressor lines and the victim line 202. Specifically, the circuit model 400 models the resistance of the wire 202 extending between driver 220 and receiver 222 into distinct resistance values 424, 426, 428, and 430. Likewise, capacitors extending between the wire and ground 432, 434, 436, 438, and 440 are also illustrated. The generation of this circuit model may be performed by presently-known extraction tools, and therefore a discussion of the manner in which the circuit model is generated need not be described herein.

Instead, the significance of the circuit model 400 is that it may be readily evaluated to determine the value of resistor 308 for the circuit model 300 of FIG. 5. Specifically, resistors 424, 426, 428, and 430 may be summed together to obtain the total resistance of the wire 202 extending between driver 220 and receiver 222. The value of resistor 306 of circuit model 300 may also be readily obtained by evaluating the netlist file, or may be obtained as an output of PathMill, or some other extraction tool. In essence, resistor 306 is the equivalent resistance as seen looking into the output of the driver 220. Therefore, when the driver is operating to pull the conductive line 202 low, then the resistance looking in the output of the driver will be the effective resistance of the NFET 450 that pulls the output of the driver 220 to ground. Likewise, and although not shown, when modeling the circuit to drive the signal on line 202 high, then the effective resistance at the output of driver 220 will be the equivalent resistance of the PFET that extends between the output of driver 220 and VDD.

After obtaining the values of resistors 306 and 308, then the value of capacitors 312 and 314 are derived. These values are derived from an evaluation of a second circuit model 500, illustrated in FIG. 6B. Like the circuit model 400, the circuit model 500 may also be readily obtained through extraction tools, and therefore the generation of this model need not be discussed herein. Indeed, with some commercially available extraction programs, a capacitive extraction may be performed by a netlist, instructing the extraction tool to lump all capacitances to ground (see circuit 400 of FIG. 6A). As illustrated, the circuit 500 is simpler to evaluate in that it excludes resistors. Capacitors 502, 504, and 506 are coupling capacitors that extend between the victim line 202 and the aggressor line 204. Likewise, capacitor 508 extends between the victim line 202 and aggressor line 206. However, the coupling capacitance 312 illustrated in the circuit model 300 of FIG. 5 is not simply a summation of the various capacitors 502, 504, 506, and 508. Instead, and in accordance with the present invention, some of these capacitances may be lumped to ground, instead of being considered as coupling between adjacent signal lines. There are various factors that may be utilized by a designer, in accordance with the present invention, to determine whether to include capacitors 502, 504, 506, and 508 in the computation of capacitor 312, or to exclude them from that computation. These factors may include, but are not limited to, the physical location of the aggressor wires in relation to the victim wires, the value of a given capacitor between the aggressor line and the victim line, and the value of the capacitor between an aggressor line and the victim, relative to the total capacitance of the victim (to ground). In addition, manual input by an engineer may also be made to determine whether a given capacitor 502, 504, 506, or 508 is a part of the coupling capacitance 312 or not. For example, if an engineer knows that aggressor line 204 is, in fact, a part of scan chain, and therefore carries no active signals at any time during normal (functional) circuit operation, then the engineer can assume that there will be zero capacitive coupling between the signal on line 204 and the signal on line 202. Therefore, the engineer may direct that all capacitors 502, 504, and 506 be lumped to ground.

Once all conductors have been identified that are deemed to capacitively couple between an aggressor line and the victim line, then the capacitance value of each of these capacitors are summed together to derive a value for capacitor 312 of circuit model 300. The remaining capacitors extending between the aggressor lines and the victim line are summed together, along with the summation of capacitors 512, 514, 516, 518, and 520 extending between the victim line 202 and ground to derive the value of capacitor 314.

Finally, the values of resistor 304 and capacitor 310 are determined. In a circuit having only one aggressor line, the value of resistor 304 is equal to the effective wire resistance of the aggressor driver at the end of its wire closest to the victim's receiver. The value of capacitor 310 is equal to the total capacitance of the aggressor that is not accounted for in the coupled capacitance of capacitor 312. The values of resistor 304 and capacitor 310, however, are much more difficult to compute when there are multiple aggressors. By assuming that the cumulative characteristics of the aggressors are similar to the characteristics of the victim, a reasonably close approximation can be made, and indeed is made in the preferred embodiment, by setting the value of resistor 304 equal to the value of resistor 308, and setting the value of capacitor 310 equal to the value of capacitor 314.

Once these component values have been computed, and the value of the voltage source (i.e., the ramp) has been computed in accordance with the equation set forth above, then the circuit 300 of FIG. 5 is evaluated. In one instance, the circuit is evaluated with a voltage ramp rising from zero to a logic high voltage. Specifically, the circuit 300 is evaluated to determine the voltage level at node X. This voltage level is then compared against a predetermined, minimum level. If the simulated voltage level does not meet or exceed the predetermined level, then the system assumes that the coupled capacitance at the receiver 222 is too high, and a warning message is generated to alert the designer of this condition. In similar fashion, the circuit is evaluated with the negative going ramp (TF) for the voltage source 302. When simulating the circuit for the negative going ramp (TF), the value for resistor 306 is also changed to model the appropriate FET within the inverter 220. Again, a voltage level at the node X is computed. If this voltage level fails to meet, or fall below a predetermined voltage level, then an appropriate warning is generated for the designer.

Having illustrated the physical properties that are evaluated by the present invention, and a simplified model circuit that is utilized to evaluate a cross-coupled capacitance, reference is now made to FIG. 7, which is a flow chart illustrating the top-level functional operation of one embodiment of the present invention. For a given node in a netlist, the present invention evaluates the cross coupling capacitance of that node, at a point closest to a receiver. Recognizing the simplified circuit model that is to be evaluated by the present invention, the invention first obtains various component values for insertion into this circuit model. In this regard, the method first obtains the total resistance of the conductor extending between a driver and the receiver whose input node is under present evaluation (step 602). Preferably, this step is performed by utilizing a first circuit model, which may be obtained from extraction tools presently known. The method then determines the total capacitance of the network of the conductor extending between the driver and receiver under evaluation (step 604). Preferably, this step utilizes a second circuit model, which may also be obtained from extraction software that is presently known. The method also obtains an aggressor coupling capacitance, which is reflective of the coupling capacitance between the various aggressor signals that are deemed to have an effect on the victim line (conductor under evaluation). In this regard, the method evaluates each aggressor separately. Therefore, the method may proceed to a first aggressor (step 606), and determine an aggressor coupling capacitance between the node under evaluation and that aggressor signal (step 608). The method may then determine whether there are additional aggressor signals to be considered (step 610). If so, the method proceeds to the next aggressor signal (step 612) and returns to step 608 and proceeds as described above.

Once all aggressor signals have been accounted for, then the method computes a ground capacitance value (step 614). This computation may be performed by subtracting the aggressor capacitance from the total capacitance of the network under evaluation. That is, all capacitances within the network that are not deemed to contribute to the aggressor capacitance may be lumped to ground, to derive a ground capacitance value. The method also determines an effective resistance of the driver that is driving the conductor under evaluation (step 616). This is essentially the output resistance of the driver. Therefore, when evaluating the cross coupling capacitance of the conductor line when the driver is driving the line from a logic high to a logic low state, then the effective resistance of the driver is the equivalent resistance of the NFET (assuming the driver is an inverter) that is used to pull the output of the driver low. Similarly, when the cross coupling capacitance of the conductor being evaluated is in transition from a logic low to a logic high level, then the effective resistance of the driver is the equivalent resistance of the PFET within the driver, that pulls the output of the driver high.

Once the various component values have been computed for the circuit model of the present invention, then the method may construct the third circuit model (step 618). As a part of this step, the method may also compute an appropriate value for a voltage source that will drive the third circuit model. In the preferred embodiment, this voltage value is a ramp signal that either ramps upward or downward depending upon the simulation. Indeed, both positive going and negative going ramp voltage source values will be computed. These voltage sources (ranp) values are utilized to simulate both rise and fall of the signal from the aggressor's driver (step 620). Using these values, and the simulation therefrom, the method obtains a voltage at an intermediate node within the third circuit model (step 622). This simulated voltage is then evaluated to determine whether it exceeds a predetermined maximum value (step 624). If so, then the method assumes that the coupling voltage noise on the receiver node exceeds a permissible level, and it may generate a coupling capacitance warning (in the form of a simulation error message) to the user (step 626). This is an indication to the circuit designer that the layout of the circuit near the receiver, and/or the conductor extending to the receiver should be redesigned.

Figure 8:
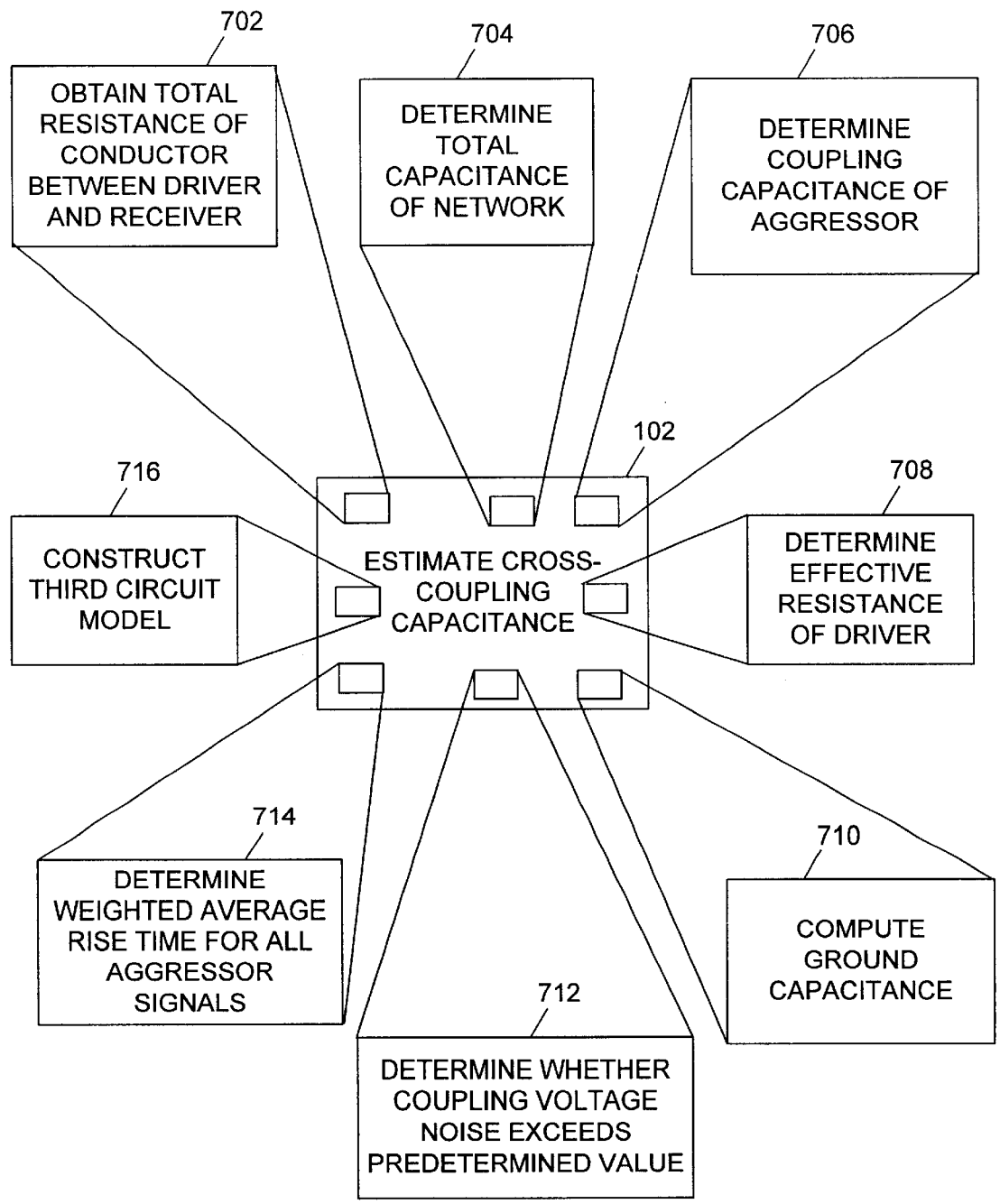
FIG. 8 is a block diagram illustrating certain fundamental code segments comprising a system constructed in accordance with the invention.

In keeping with the broader aspects of the invention, it will be appreciated that the steps illustrated in the flow chart of FIG. 7 is provided for purposes of illustration and is not deemed to be limiting on the broader aspects of the present invention. Indeed, the broader aspects of the invention may be implemented using a variety of different approaches that are still consistent with the scope and content of the present invention. As illustrated in FIG. 2, a portion 102 of the electrical rules checker program 100 of the present invention is configured to estimate the coupling voltage noise on a circuit node. In the preferred embodiment, the system comprises software which may be provided on a computer readable storage medium in the form of code segments that are particularly configured to perform various functions. In this regard, reference is now made to FIG. 8, which illustrates certain functions which may be carried out by a system constructed in accordance with the teachings of the invention. For example, a first code segment 702 may be provided to determine or obtain the total resistance of the conductor extending between a driver and the receiver, whose input node is being evaluated. This code segment may utilize a first circuit model obtained from an extraction tool. Another segment 704 may be provided to determine the total capacitance of a conductor network (RC network). This code segment may utilize a second circuit model that may be obtained from an extraction tool. Another segment 706 may be provided to determine the coupling capacitance of each aggressor that is deemed to have an effect on the receiver node. The particular identification of relevant aggressors may be determined from a variety of factors, including proximity of the aggressor conductor, knowledge of the signal activity on the aggressor, etc. Still another segment 708 may be provided to determine the effective resistance of a driver. This information may be separately computed, or may be obtained from a netlist file provided by PathMill or some other similar software tool. Another segment 710 may be provided to compute the ground capacitance (i.e., the capacitance between the victim conductor and ground). This computation may be made by subtracting from the capacitance of the relevant aggressors from the total capacitance of the conductor network. Still another segment 714 may be provided to determine the weighted average rise time and fall time of the various, relevant aggressor signals. Thereafter, another segment 716 may be executed to construct a third circuit model that utilizes the various circuit values determined from the foregoing segments, and to simulate the operation of the third circuit model with the determined values, to ascertain a voltage level on a given node. Finally, another segment 712 may be provided to determine whether the coupling voltage noise on the receiver node exceeds a permissible value. This segment may operate by comparing the simulated voltage value on the given node with a predetermined "permissible" limit. If the simulated value exceeds the predetermined limit, then a warning message may be generated to warn circuit designer that cross-coupling at the receiver node is problematic, allowing the designer to vary the current layout. Consistent with the broader concepts of the invention, additional, fewer, or different segments may also be provided.

It should be appreciated that the flow charts of FIG. 7 shows the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIG. 7. For example, two blocks shown in succession may in fact be executed substantially concurrently or the blocks may sometimes be executed in the reverse order, depending upon the functionality involved.

Mathematical Illustration of a Closed-Form Example

Having described the preferred embodiment of the present invention, a closed-form cross talk noise model will now be discussed. The following discussion is provided to reinforce the concepts set out above.

First, a closed-form expression is derived for cross talk noise when the rise time at the aggressor output is known. A circuit schematic of this model is shown in FIG. 5. In a typical electronic design automation environment, circuit timing immolators can provide a rapid and accurate estimate of the signal rise time at the output of a driver. This information significantly simplifies our driver modeling. An aggressor transistor is treated as a ramp voltage source, $V_a=V_{dd}/T_r$. A victim transistor is modeled as an effective resistance, REG. This value is taken to be the linear resistance for the p- or n-channel MOSFET, depending on the victim line's logic state. This driver resistance and the victim line resistance, REw, may be collectively lumped into a single resistance, Rv. Ra is the line resistance of the aggressor. $C_a$ and $C_v$ are the lumped capacitance for the aggressor line and victim line, respectively, and $C_c$ is the coupling capacitance between the lines (See FIG. 3B).

Based on the circuit in FIG. 5, the cross talk noise voltage $V_x$ as a function of time t is expressed as:

$$V_x = \frac{R_V C_c V_{dd}}{\tau_0 T_r}(\tau_0 + \tau_1 e^{-t/\tau_1} - \tau_2 e^{-t/\tau_2}) \quad (1)$$

for $0 \leq t \leq T_r$, and as:

$$V_x = \frac{R_v C_c V_{dd}}{\tau_0 T_r}\{\tau_1[e^{-t/\tau_1} - e^{-(t-Tr)/\tau_1}]\} - \frac{R_v C_c V_{dd}}{\tau_0 T_r}\{\tau_2[e^{-t/\tau_2} - e^{-(t-Tr)/\tau_2}]\} \quad (2)$$

for $T_r \leq t$, where Vdd is the supply voltage, Tr is the rise time at the output of the aggressor driver, and $$\tau_2^0 = [R_a(C_a+C_c)+R_v(C_v+C_c)]^2 - 4R_v R_a(C_v C_c + C_v C_a + C_c C_a) \quad (3)$$

$$\tau_1 = \frac{[2R_v R_a(C_v C_c + C_v C_a + C_c C_a)]}{[R_a(C_a+C_c)+R_v(C_v+C_c)+\tau_0]} \quad (4)$$

$$\tau_2 = \frac{[2R_v R_a(C_v C_c + C_v C_a + C_c C_a)]}{[R_a(C_a+C_c)+R_v(C_v+C_c)-\tau_0]} \quad (5)$$

The peak voltage, $V_{x,max}$, occurs when $T_r \leq t$. Therefore, by differentiating equation 2 with respect to t, results in:

$$Vx, \max = \frac{R_v C_c V_{dd}}{\tau_0 Tr}\left[\varphi_1 \tau_1 \left(\frac{\varphi_1}{\varphi_2}\right)^{\tau_2/(\tau_1-\tau_2)} - \varphi_2 \tau_2 \left(\frac{\varphi_1}{\varphi_2}\right)^{\tau_1/(\tau_1-\tau_2)}\right], \quad (6)$$

where $\phi_1 = \exp(-T_r/\tau_1) - 1$ and $\phi_2 = \exp(-T_r/\tau_2) - 1$. For a sufficiently slow rise time ($T_r >> \tau_2$), $V_{x,max}$ approaches the limit of $R_v C_c V_{dd}/T_r$. Also, for a special case where $R_a = R_v$, $C_a = C_v$, and $T_r = 0$, equation 6 reduces to the following simple model, which is known.

$$V_{x,\max} = \frac{V_{dd}}{2} \frac{C_c}{C_a + C_c}. \quad (7)$$

The accuracy of the model of FIG. 5 can be readily demonstrated for a representative cross-sectional geometry of a global line in 0.25-μm technology. To account appropriately for the distributed nature of the interconnect RC network, the lumped ground capacitances $C_a$ and $C_v$ may be scaled by a factor of 0.5 based on the Elmore delay model, which is known. The lumped coupling capacitance $C_c$, on the other hand, may be scaled by a semi-empirical, technology independent factor, $\alpha = (1-\beta)[\exp(-T_r/\tau_0)]+\beta$. The parameter β accounts for the presence of the victim driver resistance, and may be given by $\beta = 0.5[1+R_{vd}/(R_{vi}+R_{vd})]$. β is unity for a device-dominated case in which shielding resulting from interconnect resistance is negligible, and it decreases monotonically to 0.5 as interconnect becomes more dominant. The scaling factor α is equal to β for a slow rise time, but monotonically approaches unity for a sufficiently fast rise time.

Since the parameter values in equations 1 through 7 are readily available from timing analysis tools, this model forms an excellent basis for a cross talk screening tool at the timing level. The nonproblematic signal lines can be quickly identified and filtered with this model. Only those lines that potentially violate noise margin need further detailed simulations. The efficiency of signal integrity verification can be significantly improved by this scheme.

Next, a case is considered in which the rise time to the input of the aggressor transistor is known. In this case the rise time at the output of the aggressor transistor is first computed as a function of the input rise time using a technology dependent function. Then, Equation 6 is used to calculate the maximum cross talk noise.

The rise time at the output of the aggressor transistor, $T_r$, is expressed as:

$$T_r = T_{ri} + T_{rw} + T_{rc}, \quad (8)$$

where $T_{ri}$, $T_{rw}$, and $T_{rc}$ account for the intrinsic delay, input slope, and interconnect loading dependencies, respectively.

The intrinsic delay dependency of the aggressor output rise time, $T_{ri}$, is empirically expressed as:

$$T_{ri} = k_i \frac{V_{dd}}{I_{d,sat}} C_j, \quad (9)$$

where $V_{dd}$ is the supply voltage, $I_{d,sat}$ is the saturation source-to-drain current, and $C_j$ is the junction capacitance. The $T_{ri}$ term is usually small (~5 ps) and is independent of the aggressor input rise time. It is also independent of device size; both $I_{d,sat}$ and $C_j$ increase as the driver size increases, canceling each other. The term $k_i$ is a fitting parameter. It can be shown that $k_i = 0.4$ for many different technology generations. The $T_{ri}$ term is important only for the following cases:

Older technology generations for which the RC of a device is significant

A transistor with extremely small loads

Very fast input rise time (<35 ps).

None of these cases is of practical interest in deep-submicrometer technologies.

The input slope dependency of the aggressor output rise time, $T_{rw}$, is a linear function of the aggressor input rise time, $T_{ra}$:

$$T_{rw} = k_w T_{ra}, \quad (10)$$

where $k_w$ is a technology dependent fitting parameter and is typically between 0.1 and 0.2 for deep-submicrometer technologies. This linear relationship holds extremely well for the practical values of $T_{ra}$ ranging from 50 ps to 500 ps. This input slope dependency term can be very significant, especially for slower input signals and small load capacitances. For instance, for a 1-mm line with $T_{ra} = 160$ ps, $T_{rw}$ can be as high as 30% of $T_r$.

The third term in equation 8 results from the charging and discharging of the interconnect through the aggressor driver. Since the driver goes through both the saturation and linear modes of operation during the charging and discharging, $T_{rc}$ has two corresponding terms:

$$T_{rc} = \gamma \xi C_i \left[ \frac{V_t - 0.1 V_{dd}}{I_{d,sat}} \right] + \gamma \xi C_i \left[ \frac{1}{K(V_{dd} - V_t)} \ln\left( \frac{19 V_{dd} - 20 V_t}{V_{dd}} \right) \right], \quad (11)$$

where $C_i$ is the interconnect capacitance, $V_t$ is the threshold voltage of the driver, and k is the device transconductance, which is given by:

$$K = \frac{2 I_{d,sat}}{(V_{dd} - V_t)^2}. \quad (12)$$

The term γ is an empirical expression to account for capacitance shielding caused by interconnect resistance, and is given by:

$$\gamma = 1 - \left[ \frac{R_{ai}}{R_{ai} + R_{ad}\sqrt{3}} \right]^4, \quad (13)$$

where $R_{ai}$ and $R_{ad}$ are the aggressor line resistance and driver resistance, respectively. The term ξ is an empirical constant accounting for the loss due to short-circuit current and is typically equal to 1.2. Short-circuit current does not serve to charge or discharge the line.

The first term in equation 11 describes the transient in the saturation region, but is typically much smaller than the second term because of the large current drive and the small voltage swing in the saturation region. The second term is for the transient in the linear region, and is technology dependent only on the ratio of $V_t/V_{dd}$.

Rise time values at the output of the aggressor driver calculated based on equations 8 through 13 for a wide range of interconnect lengths have been compared with SPICE simulations. The model predictions are in good agreement with SPICE simulations. Indeed, the modeling error compared with SPICE has been shown to be less than 10%.

The technology dependent fitting coefficients in equations 9 through 11 can be found easily by running SPICE for several calibration cases. With the calibrated coefficients, this model rapidly generates accurate cross talk noise estimation for various driver sizes, interconnect loads, and rise times. The model is an attractive alternative to SPICE when many transistor-level simulations for cross talk noise are needed, including the case of quick screening mentioned earlier.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for approximating the coupling voltage noise on a node in a circuit comprising the steps of:

using a first circuit model to obtain a total resistance value of a conductor extending between a driver configured to drive the node and a receiver;

using a second circuit model to determine a total capacitance;

determining an aggressor coupling capacitance between the node and an aggressor signal using at least one criteria;

computing a ground capacitance by subtracting the aggressor coupling capacitance from the total capacitance;

determining the effective resistance of the driver;

determining a weighted average rise time for all aggressor signals on the node;

constructing a third circuit model; and using the conductor resistance, the total capacitance, the aggressor coupling capacitance, the ground capacitance, the effective resistance of the driver, and the weighted average rise time in the third circuit model to determine whether the coupling voltage noise on the node exceeds a predetermined value.

2. The method as defined in claim 1, wherein the step of using the conductive resistance and other values to determine the aggressor coupling capacitance of the node further includes evaluating the third circuit model to determine a voltage level at an interim node and comparing the determined voltage level against a predetermined voltage level.

3. The method as defined in claim 1, wherein the step of constructing a third circuit model includes using the weight average rise time as voltage source for the third circuit.

4. The method as defined in claim 3, wherein the step of constructing a third circuit model includes disposing the conductor resistance and the effective resistance of the driver in series relationship with the voltage source.

5. The method as defined in claim 4, wherein the step of constructing a third circuit model further includes disposing the aggressor coupling capacitance in series relationship with the series disposition of the conductive resistance and the effective resistance of the driver.

6. The method as defined in claim 4, wherein the step of constructing a third circuit model further includes disposing the ground capacitance in parallel with the series disposition of the conductor resistance and the effective resistance of the driver.

7. The method as defined in claim 4, wherein the step of constructing a third circuit model further includes disposing the aggressor coupling capacitance in series relationship with the series disposition of the conductive resistance and the effective resistance of the driver.

8. The method as defined in claim 2, wherein the step of evaluating the third circuit at an interim node more specifically includes evaluating the third circuit at a node that is common to the aggressor coupling capacitance, the ground capacitance, and the series disposition of the conductive resistance and the effective resistance of the driver.

9. The method as defined in claim 7, further including the step of determining an effective resistance of a driver of an aggressor signal, at an end of the aggressor wire closest to the node.

10. The method as defined in claim 9, wherein the step of evaluating the third circuit further including the step of disposing the determined effective resistance of the driver of the aggressor signal between the voltage source and the aggressor coupling capacitance, and in series relationship therewith.

11. The method as defined in claim 10, wherein the step of determining an effective resistance of a wire of an aggressor signal more specifically includes approximating the effective resistance of the driver of the aggressor signal to be equal to the conductor resistance of the node.

12. The method as defined in claim 10, further including the step of determining a remainder capacitance, the remainder capacitance being an approximation of a total capacitance of the aggressor that is not accounted for in the aggressor coupling capacitance.

13. The method as defined in claim 12, wherein the step of evaluating the third circuit further includes the step of disposing the determined remainder capacitance in parallel disposition with the series combination of the voltage source and the determined effective resistance of the driver of an aggressor signal.

14. The method as defined in claim 12, wherein the step of determining a remainder capacitance more specifically includes approximating the effective remainder capacitance to be equal to the aggressor coupling capacitance.

15. The method as defined in claim 1, further including the step of obtaining the first circuit model and the second circuit model from a capacitance extraction program.

16. The method as defined in claim 1, wherein the step of using the second circuit model further includes the step of ignoring resistance values between the driver and the receiver on the node.

17. A computer readable medium containing program code for approximating the coupling voltage noise on a node in a circuit comprising:

a first segment configured to obtaining a total resistance value of a conductor extending between a driver configured to drive the node and a receiver;

a second segment configured to determine a total capacitance;

a third segment configured to determine an aggressor coupling capacitance between the node and an aggressor signal using at least one criteria;

a fourth segment configured to compute a ground capacitance by subtracting the coupling capacitance from the total capacitance;

a fifth segment configured to determine the effective resistance of the driver;

a sixth segment configured to determine a weighted average rise time for all aggressor signals on the node;

a seventh segment configured to construct a third circuit model; and an eight segment configured to determine whether the coupling voltage noise on the node exceeds a predetermined value.

18. A method for approximating the coupling voltage noise on a node in a circuit comprising the steps of:

determining a total resistance value of a conductor extending between a driver configured to drive the node and a receiver on the node;

determining a total capacitance for the node;

determining an aggressor coupling capacitance between the node and an aggressor signal using at least one criteria;

computing a ground capacitance by subtracting the aggressor coupling capacitance from the total capacitance;

determining the effective resistance of the driver;

determining a weighted average rise time for all aggressor signals on the node; and evaluating a third circuit model using determined values to determine whether the coupling voltage noise on the node exceeds a predetermined value.

* * * * *